United States Patent [19]
Burnsides

[11] Patent Number: 5,157,326
[45] Date of Patent: Oct. 20, 1992

[54] BOARD ASSEMBLY FOR VALIDATION AND CHARACTERIZATION OF A BUS SYSTEM

[76] Inventor: Barry W. Burnsides, 2190 Castillejo Way, Fremont, Calif. 94539

[21] Appl. No.: 736,011

[22] Filed: Jul. 25, 1991

[51] Int. Cl.⁵ .......................................... G01R 31/02
[52] U.S. Cl. ................... 324/158 F; 324/73.1
[58] Field of Search ............. 324/158 R, 158 F, 73.1, 324/537, 538; 210/209; 371/29.5

[56] References Cited

U.S. PATENT DOCUMENTS

| | | | |
|---|---|---|---|
| 4,542,341 | 9/1985 | Santomango et al. | 324/158 F |
| 4,607,220 | 8/1986 | Hollman | 324/158 F |
| 4,777,434 | 10/1988 | Miller et al. | 324/158 F |
| 4,978,914 | 12/1990 | Akimoto et al. | 324/73.1 |

OTHER PUBLICATIONS

Coombs, Tim, "How to use special-purpose tools to debug your VMEbus systems," *VMEbus Systems*, Aug., 1990.

Primary Examiner—Ernest F. Karlsen
Attorney, Agent, or Firm—Schneck & McHugh

[57] ABSTRACT

Characterization and validation boards having the capability of allowing selective variation of current loading, localized heating, operational speed and signal pin assignment. Each printed circuit board includes a connector that is electrically coupled to a backplane of a bus system. The connector has power, ground and signal contacts. On a first side of each printed circuit board is a series of parallel circuits of resistors grounded at first ends and individually connected to switches at second ends. The switches allow a user to select a desired current load for each power contact and to emulate thermal characteristics of other boards. Clock circuitry is programmable to transmit or receive selectable clock frequencies. Bus interface circuitry, along with shorting jumpers select from a plurality of signal outputs to programmable signal contacts of the connector.

17 Claims, 5 Drawing Sheets

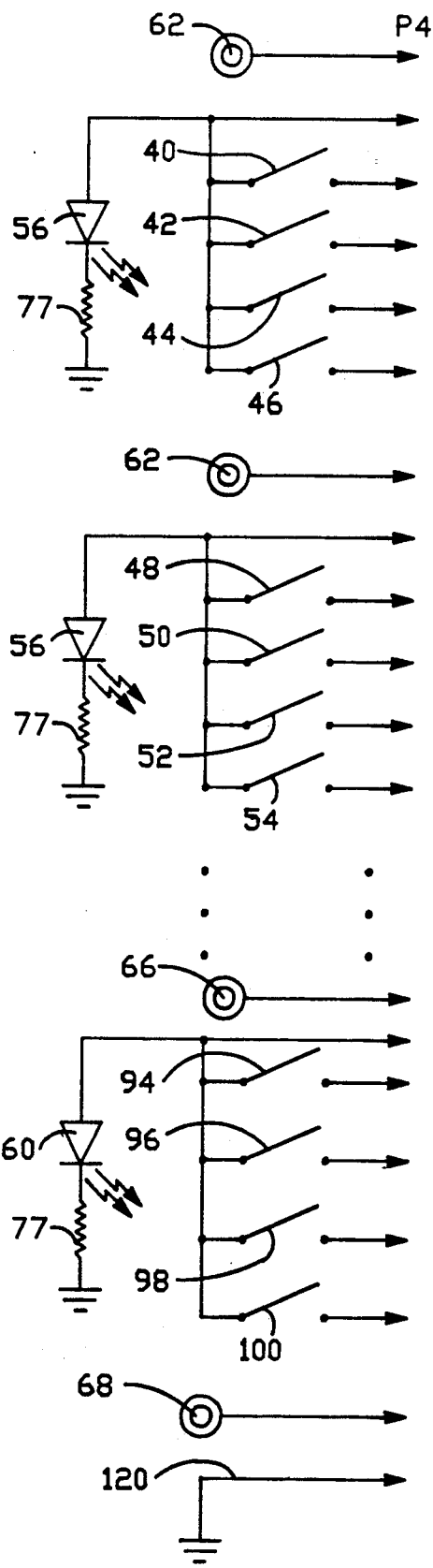
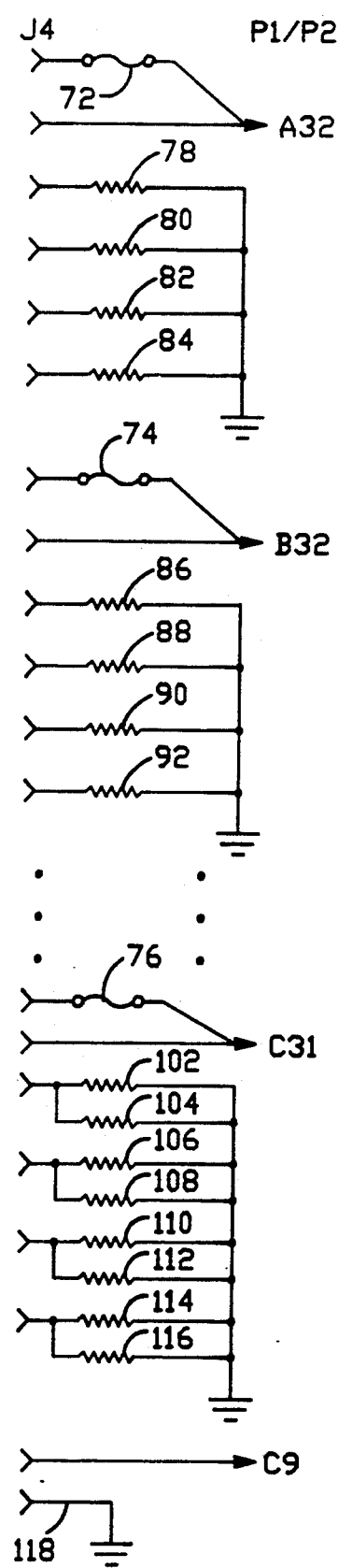
FIG.-2
FIG.-3

BOARD ASSEMBLY FOR VALIDATION AND CHARACTERIZATION OF A BUS SYSTEM

TECHNICAL FIELD

The present invention relates generally to devices for testing a multi-circuit board system and more particularly to devices for confirming proper operation and determining operational limits of a bus system.

BACKGROUND ART

Integration of a number of populated printed circuit boards originating from various designers into a single system is simplified by using a backplane standard, such as a VMEbus. The backplane may be fixed to a card rack having slots for insertion of the printed circuit boards. Connectors on the backplane are directed to receive the boards to allow electrical communication among the boards. Under the present VMEbus specification, a backplane may be sufficiently wide to interconnect 21 daughter boards.

While a particular backplane standard has a specific pin assignment for power, ground and signals, there is typically a great amount of flexibility in the bus specification for the standard. For example, the VMEbus specification allows a VMEbus system to be based upon a J1 backplane or upon a J1 and J2 backplane. Provided that the utility pin assignment dictated by the bus specification is met, a backplane manufacturer may have its own design for power distribution across the backplane. One aspect of performance of a backplane relates to the ability of the backplane to distribute power within specified voltage tolerances to each daughter board in a bus system.

Another aspect of performance is the ability of a backplane to convey signals among the daughter boards at the operating speed of the system in a manner in which each signal is understood at a receiving end. Multiprocessing capability provides a number of advantages, but leads to complexity that requires exacting design engineering to maximize the capability.

Factors that affect signal performance and that are within the control of a backplane manufacturer include the type and quality of substrate material, the amount of copper in a ground system, the placement of ground planes relative to signal planes, the uniformity of signal trace widths across the length of the signal traces, and the location of terminations. Even within a particular backplane standard, performance-effecting structural differences exist between the products of one backplane manufacturer and those of another. Depending upon quality control tolerances of a particular manufacturer, signal performance may even vary significantly among backplanes produced from a single source.

Thus, it would be to the benefit of users to have availability to diagnostic tools for characterization of a backplane. "Characterization" is defined as testing of a product in order to determine the limits of operation of the product. The VMEbus specification requires that signals pass across a backplane having 21 populated slots at a clock frequency of at least 16 MHz. However, a user may desire operation at 32 MHz. Characterization testing would allow a user to determine the upper limit of operational speed. Likewise, characterization of ground shift from a board in one slot to a board in a second slot may be important to ensuring that an acceptable signal-to-noise ratio will be achieved by utilizing a particular backplane.

For many users of backplanes, characterization testing to determine limits of operation is not the primary concern. Rather, validation is the focus. "Validation" is defined as testing to confirm proper operation of a given configuration of a system. There are a number of factors outside the control of a backplane manufacturer that influence signal performance and power performance. Validation assures a user that a fully integrated system will operate properly.

It is an object of the present invention to provide a diagnostic device and system for validation and characterization of a bus system that includes a backplane.

SUMMARY OF THE INVENTION

The above object has been met by printed circuit boards that are not specifically designed for diagnostic purposes, but rather that provide a means for determining the operational limits of a bus system and confirming that capability of integration of a proposed system configuration. The boards have the capability of allowing selective variation of current loading, localized heating, operational speed and signal pin assignment.

Each printed circuit board includes a connector that is electrically coupled to a backplane of a bus system. The connector includes power, ground and signal contacts. Networks of resistors are disposed on a first side of the printed circuit board. Each network includes parallel circuits of resistors that are dedicated to a particular power contact. The parallel circuits of a network are grounded at first ends and are connected to individual switches at second ends. The switches allow a user to select a current load for each power contact, allowing characterization of the power loss of a power supply cable harness, the ground shift between points in the system, and the voltage drop across the backplane. Selective current loading of each power contact also allows emulation of the current demand of a proposed board, such as a video graphics board, to validate that the power feed and distribution of the system configuration will perform as designed when the proposed board is inserted.

Preferably, a number of validation and characterization printed circuit boards are electrically coupled to the backplane, with each board including clock generation and control circuitry and a bus interface. Relocating shorting jumpers allows selection of signal outputs to various signal contacts. Thus, a backplane system can be tested to determine such things as signal crosstalk and signal propagational delay. The clock circuitry includes a bank of switches that allows a user to choose among a number of clock frequencies for the purpose of determining operational speed of a system.

The switches of a validation and characterization board are located on a front panel that is attached to the board at an edge opposite to the connector. The front panel also includes test points that are connected to the power contacts by dedicated conductive paths. Likewise, a ground test point is connected to a ground contact of the connector via a dedicated conductive path.

Thermal testing of a planned system configuration is possible because the resistors act as heat-generating members. The resistors are high-wattage members that can be selectively energized to emulate the localized heating of a proposed board to be placed in a system. That is, hot-spots can be emulated. In like manner, use of a number of validation and characterization boards may be used in determining whether dead spots exist in cooling of a system. Preferably, the front panel of each board includes an array of holes that permit insertion of thermocouple leads.

BRIEF DESCRIPTION OF THE DRAWINGS

FIG. 2 is a schematic of a front panel of a board of FIG. 1.

FIG. 3 is a schematic of a passive portion of the printed circuit board of FIG. 1.

BEST MODE FOR CARRYING OUT THE INVENTION

Figure 1:
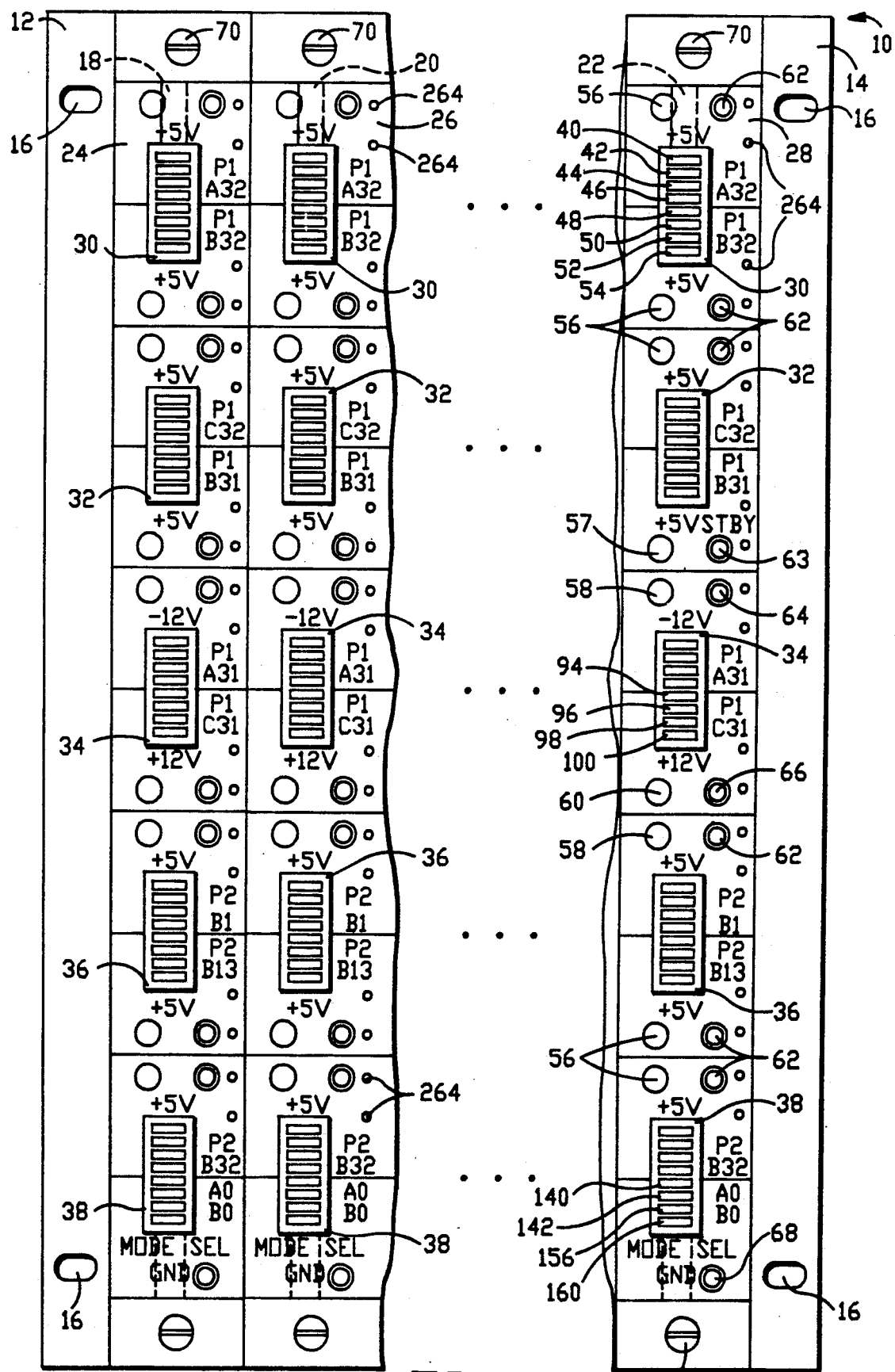
FIG. 1 is a front view of a system for validation and characterization testing of an apparatus having a backplane in accord with the present invention.

With reference to FIG. 1, a rack mount chassis 10 is shown as including two mounting flanges 12 and 14 having holes 16 to receive mounting hardware, not shown. The rack mount chassis is of the type well known in the art and is commercially available. The rack mount chassis houses a backplane, or motherboard. The backplane includes a number of conductive paths that extend parallel to each other for electrical connection to evenly spaced connectors which support individual daughter boards. The backplane provides utilities and signals to the daughter boards and allows electrical communication among the daughter boards.

The daughter boards are slidably received within slotted card guides, not shown, fixed to the rack mount chassis 10. While it is not critical, the daughter boards may have a Eurocard arrangement of a 96-pin terminal connector, with the 96 pins arranged in three rows of 32 contacts spaced apart by a distance of 0.1 inch. The present invention will be illustrated and described with reference to use of a VMEbus system, but can be used for characterization and validation of other bus systems with the appropriate changes to such factors as pin assignment or connector type. Under the VMEbus specification for backplanes having J1 and J2 connectors of 96 pins arranged in three rows, there are assignments of six contacts for +5V, one contact for +12V, one contact for −12V, one contact for +5V standby, and 12 contacts for ground. A maximum of 21 slots for daughter boards is specified. In FIG. 1, portions of three of 21 daughter boards 18, 20 and 22 are shown in phantom. In the present invention, the daughter boards are test boards for characterizing and validating the bus system.

Each test board 18, 20 and 22 is mechanically and electrically coupled to a front panel 24, 26 and 28. The front panels include five banks 30, 32, 34, 36 and 38 of eight switches. Each bank 30–38 is functionally divided, with four of the eight switches in a bank being operatively associated with one of the above-identified power contacts. For example, the uppermost bank 30 of the characterization and validation board 22 includes four switches 40, 42, 44 and 46 operatively associated with the +5V at contact 32 of row A of the J1/P1 connector, and includes four switches 48, 50, 52 and 54 operatively associated with contact 32 in row B of the same connector. Each of the nine power contacts of the VMEbus is operatively associated with four switches.

Also on the front panels 24, 26 and 28 are arrays of LEDs 56, 57, 58 and 60 and test points 62, 63, 64, 66 and 68. Each +5V power contact is connected to one of the LEDs 56 and one test point 62. A +5V standby is in electrical communication with a separate LED 57 and test point 63. Likewise, the −12V power contact is connected to an LED 58 and a test point 64 and the +12V power contact is connected to a separate LED 60 and test point 66. A dedicated conductive path exists from a ground contact to the remaining test point 68.

Screws 70 secure the front panel 24–28 to the rack mount chassis 10. Typically, injectors/ejectors are included to facilitate removal of the test boards 18–22 from the rack mount chassis 10.

The present invention includes alternative passive and active embodiments of the characterization and validation test boards 18, 20 and 22. In either case, the front panel 24–28 is identical and the test board includes networks of resistors that are selectively connected to a power contact by switches within the banks of switches 30–38. FIG. 2 is an electrical schematic of a front panel, and FIG. 3 is an electrical schematic of the networks of resistors on a test board. Contacts of P4 of a front panel connect to contacts of J4 of the test board to provide electrical communication between the front panel and the test board. Communication with the backplane is via the contacts of P1 and P2.

The passive circuitry of FIG. 3 includes the networks of resistors. The resistors are high-wattage members that are individually selected from the front panel for current loading of each power contact. The current loading is provided by manipulation of the banks of switches 30–38 described above.

As shown in FIGS. 2 and 3, +5V from contact A32 of connector P1 is routed through two separate paths to the front panel. One path passes through a fusible trace 72 to the contact of J4. The fusible trace may be a 5 mil trace between two pads on the test board. If the test point 62 is inadvertently shorted, the fusible trace 72 will burn open, thereby protecting the remaining trace path of the test board. A replacement wire of suitable diameter to act as a fuse may then be used to replace the original fusible trace 72. Other than the ground test point 68, each front panel test point 62–66 is protected by a fusible trace 72, 74 and 76.

The second path to the front panel is a direct path that connects to the LED 56 and to one pole of each switch 40–46. A current limiting resistor 77 connects the LED to ground. The two separate paths from the backplane power contact A32 to the front panel prevent resistive loading currents from affecting voltmeter readings taken at the test point 62. Each test point 62–68 has a dedicated path between the associated backplane power contact and the front panel monitoring test point.

When the +5V at contact A32 of P1 is active, the LED 56 will light. The switches 40–46 individually control current passing through 10 ohm resistors 78, 80, 82 and 84 on the test board. Each switch closure presents +5V at one side of the selected resistor. The opposite side of the resistor is tied to ground. This causes a 0.5 amp current load for each resistor that is selected. With the four resistors in the network, the contact pin can be loaded to a maximum of 2 amps.

In the active embodiment, contact A32 of P1 provides VCC power for a bus interface. The current loading for A32 then varies depending upon what functions are selected. As such, the resistors 78-84 are not installed on the active embodiment of the test board. The front panel switches 40-46 are functional, but since no resistors exist on the test board, the switches do not produce any additional loading.

Each of the +5V and +5V standby contact pins of P1 and P2 of the test board includes a dedicated conductive path having a fusible trace 72-74 to the front panel for the test point 62-66, a separate path for the LED 56-57, a bank of four switches and a network of four resistors. The switches 48-54 and four resistors 86, 88, 90 and 92 are shown for the +5V received at B32.

While the switch banks for the power contacts associated with +12V and −12V are identical to the switch banks described above, the networks of resistors are different. Each switch 94, 96, 98 and 100 presents +12V at one side of a selected resistor pair, with the resistor pairs comprising resistors 102, 104, 106, 108, 110, 112, 114 and 116. The opposite side of each resistor pair is tied to ground. This causes 0.51 amps of current load for each resistor pair selected. With the four resistor pairs in the array, each +12V backplane power contact can be loaded to a maximum of 2.04 amps. An identical circuit is utilized for the −12V power contact. Resistor pairs are utilized for 12 volt loading in order to spread the power dissipation and heat among multiple devices.

Two separate ground paths are routed to the front panel. One path originates from the VMEbus connector P1 at ground contact C9. This path is dedicated to the front panel test point 68 ground function and is isolated from all other test board functions to preclude any ground currents from flowing through the backplane connector that may invalidate readings taken from the front panel test point 68.

The second ground path is from the substrate ground of the test board to the front panel. This path is illustrated as traces 118 and 120 and is used for the LED return current. As will be explained more fully below, this path also is used for control grounds for a control switch bank.

Figure 4:
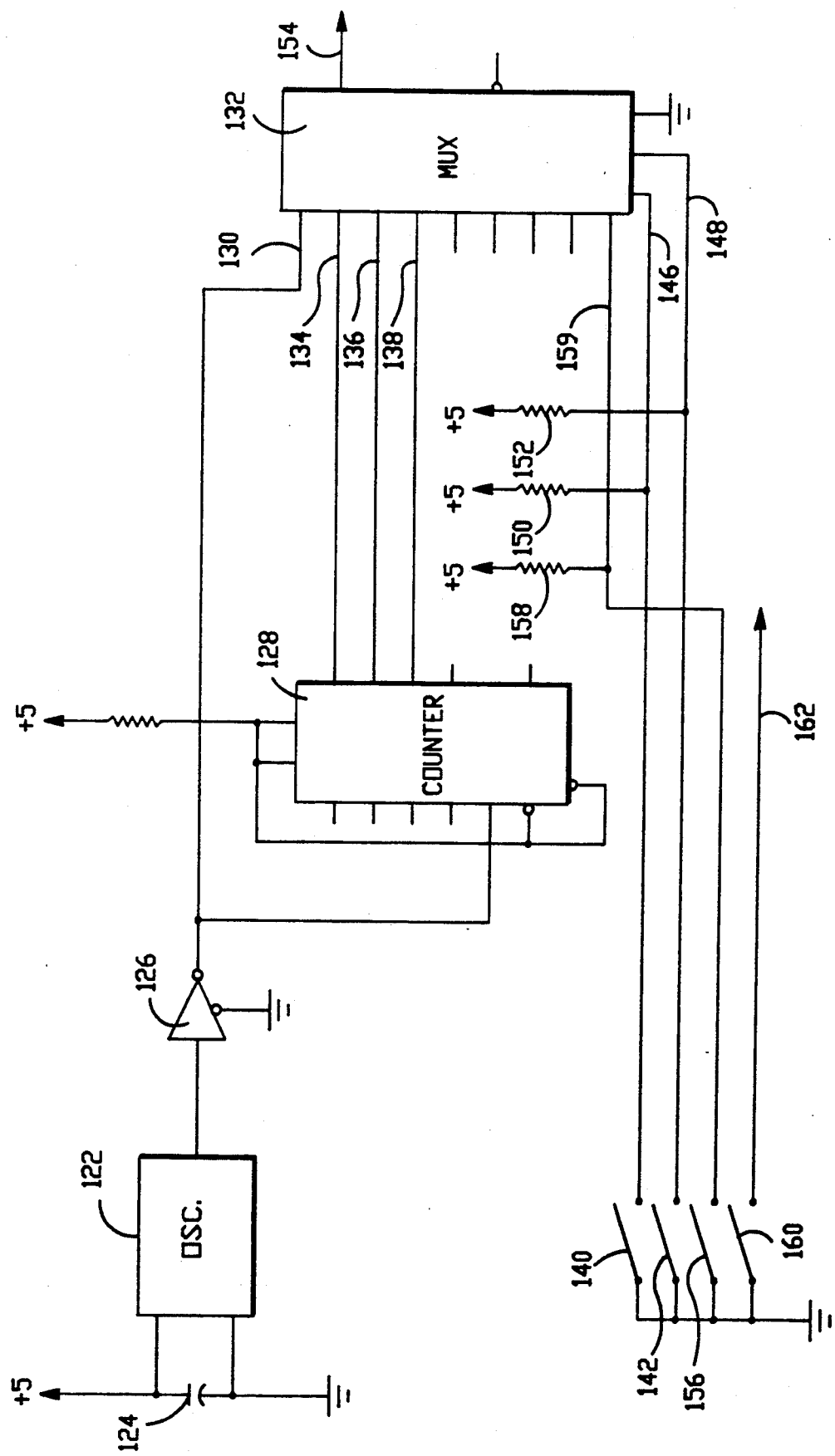
FIG. 4 is a schematic of clock circuitry of the board of FIG. 1.

FIGS. 4-7 illustrate circuitry that is found on the active embodiment of the test boards. A clock generation and control circuit is shown in FIG. 4. A crystal oscillator 122 provides a fundamental frequency of 64 MHz. A by-pass capacitor 124 is shown. The clock output is fed to a buffer 126. The clock is buffered in order to maintain clean edges and to ensure sufficient drive to subsequent devices. The buffer output is channeled to both a clock input of a counter 128 and a first input 130 of a multiplexer 132. The counter 128 may be a 4-bit binary synchronous counter, such as that sold as a 74S163. The purpose of the counter is to generate alternative frequencies from the buffered fundamental 64 MHz clock. Here, three alternative frequencies are provided to the multiplexer 132 at inputs 134, 136 and 138. Preferably, the alternative clocks have frequencies of 32, 16 and 8 MHz.

The multiplexer 132 is used as a one-of-four data selector. One of the four inputs 130, 134, 136 and 138 is selected by the user by manipulation of two front panel switches 140 and 142. When both switches are open, as shown in FIG. 4, the multiplexer pins 146 and 148 associated with the switches 140 and 142 are pulled high by the pull-up resistors 150 and 152. This represents a binary "3" that causes the fourth input 138 to be selected, resulting in an output 154 of 8 MHz. Closing both of the switches 140 and 142 grounds the two multiplexer pins 146 and 148, representing a binary "0" for selection of the first input 130 of 64 MHz. The binary codes 1 and 2 are used for selecting the second input 134 and the third input 136, respectively, to provide alternative clocks of 32 MHz and 16 MHz at the multiplexer output 154.

A CLKEN switch 156 at the front panel may be used to force the multiplexer output 154 high. When the switch is open, a pull-up resistor 158 provides an input high to the multiplexer at line 159 and forces the output 154 high. If the switch is closed, however, a low is presented, enabling selection of the alternative clocks to be output.

Preferably, the selected clock from multiplexer output 154 is routed to eight inverting buffers that provide the drive required for high fan out of the clocks to the inputs of drivers to the bus. As will be described more fully below, the outputs of the buffers are routed to a series of pin strips that allow a user to place shorting jumpers for sending clocks to the bus.

The active test board may be placed into a send or a receive mode by manipulation of a SEND switch 160. A SEND line 162 is routed to all devices driving to or receiving from the bus. When the switch is closed, a low is presented to all the devices, prohibiting driving the bus while enabling a receive mode. When the switch 160 is open, the SEND line goes high, enabling the drivers to the bus. The address and data paths to the bus use transceivers, and the SEND line controls the direction through the transceivers. By definition, the transceivers can be in either a transmit or receive mode, but cannot transmit and receive simultaneously. The control circuitry is implemented using both drivers and receivers. The SEND line 162 enables or disables the control drivers to the bus. The control receivers are active at all times, regardless of the state of the SEND line.

Figure 5:
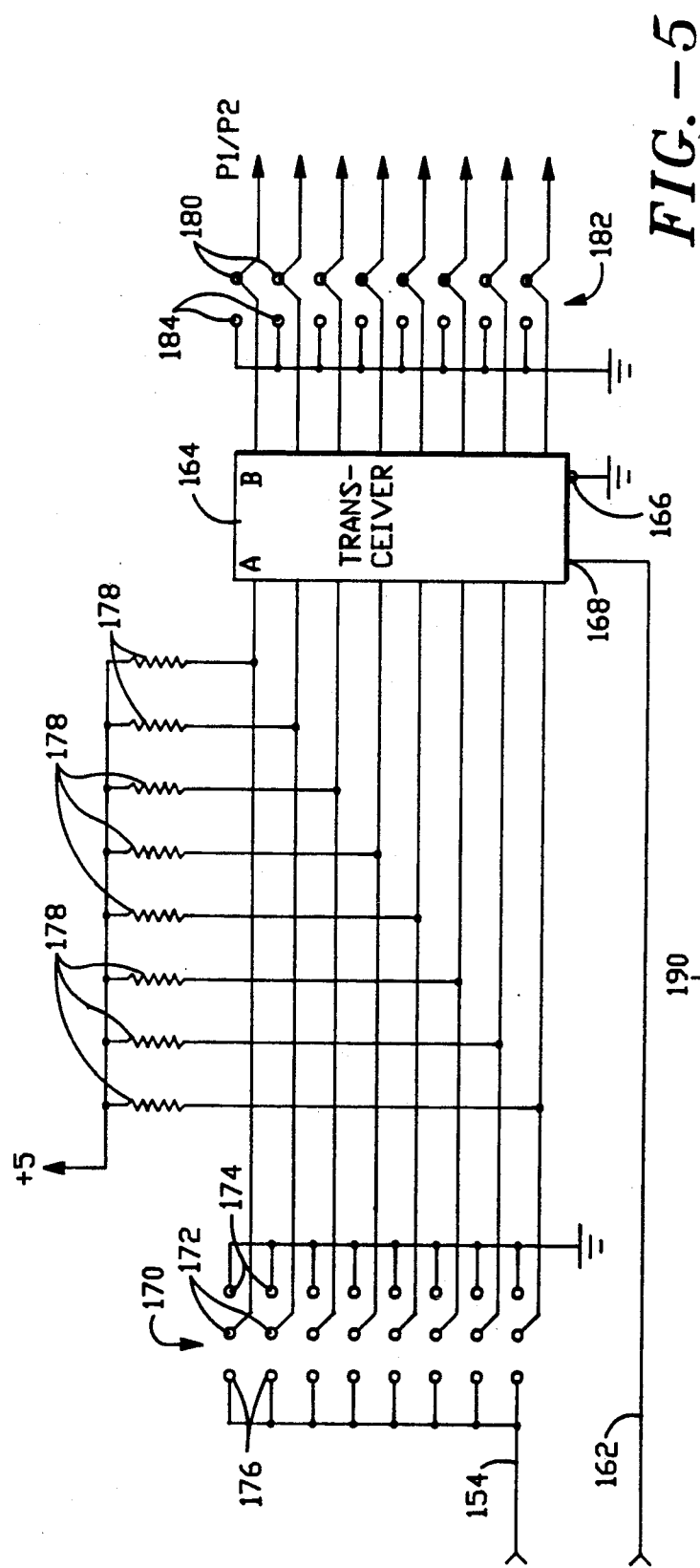
FIG. 5 is a schematic of a data bus transceiver of the board of FIG. 1.

Referring now to FIG. 5, the active test board uses octal bus transceivers 164 with three-state outputs for driving address bits onto and receiving address bits from the bus. In a VMEbus system, all address bus transceivers 164 are type 74ALS245A-1, but this is not critical. The transceivers provide a 48 mA low state sink current during drive and minimal capacitive loading during receive, as called for in the VMEbus specification. The enable input 166 is permanently tied to ground, so that a transceiver is in either a transmit or receive mode, depending on the state of a direction input 168.

A 32-bit address interface to the VMEbus is implemented using four identical octal bus transceivers. FIG. 5 illustrates only one of four identical sections of the interface.

The SEND line 162 that originates from the SEND switch described above is connected to the direction input 168 of the transceiver 164. When the line is high, the address on the "A" inputs of the transceiver 164 is directed to the "B" outputs. This state is defined as transmit mode. The address information on the "A" inputs originates from the user programmable pins of a three-row pin strip 170. Because the octal bus transceiver 164 is non-inverting, address information presented to the VME-bus has the same polarity as the "A" inputs programmed by a user at the pin strip 170. The three-row pin strip is designed to allow selection of one of three possible signal sources. A center row of pins 172 is connected to the "A" inputs of the transceiver 164. One side row of pins 174 is tied to ground. The opposite side row of pins 176 receives the selected clock frequency from the multiplexer output 154 described above. Again, preferably there is a buffer between the multiplexer output 154 and subsequent circuitry such as that shown in FIG. 5, but for the sake of simplicity the buffers have not been illustrated.

With no shorting jumpers installed at the pin strip 170, pull-up resistors 178 provide a high at the "A" inputs of the transceiver 164. Alternatively, shorting jumpers from a center pin 172 to a ground pin 174 grounds an "A" input associated with the center pin 172. In like manner, a jumper placed from the center pin 172 to a clock pin 176 provides the selected clock frequency to the associated "A" input. Signals sent to the VMEbus via a P1 connector or a P2 connector may be monitored at a row of pins 180 of a two-row pin strip 182. The first row of pins 184 provides reference ground pins adjacent to the signal pins 180, thereby ensuring a minimal inductive ground return path for the signal.

When the SEND line is low, the address information at the monitoring pins 180 is directed to the "A" pins of the transceiver 164 via the "B" pins. This state is defined as receive mode. The address information at the "B" pins originates from the bus. The three-row pin strip 170 is designed to allow a user to select signal sources during the transmit mode. Therefore, when in the receive mode, all shorting jumpers should be removed from the pin strip 170.

A circuit identical to that of FIG. 5 is used for the data transceivers. Again, in a 32-bit data interface to a VMEbus, four identical octal bus transceivers are used. This brings the total of octal bus transceivers to eight.

Figure 6:
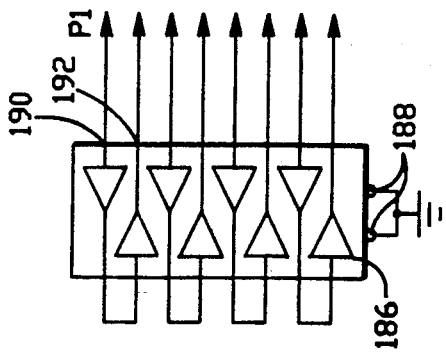
FIGS. 6–7 are schematic views of control circuitry of the board of FIG. 1.
Figure 7:
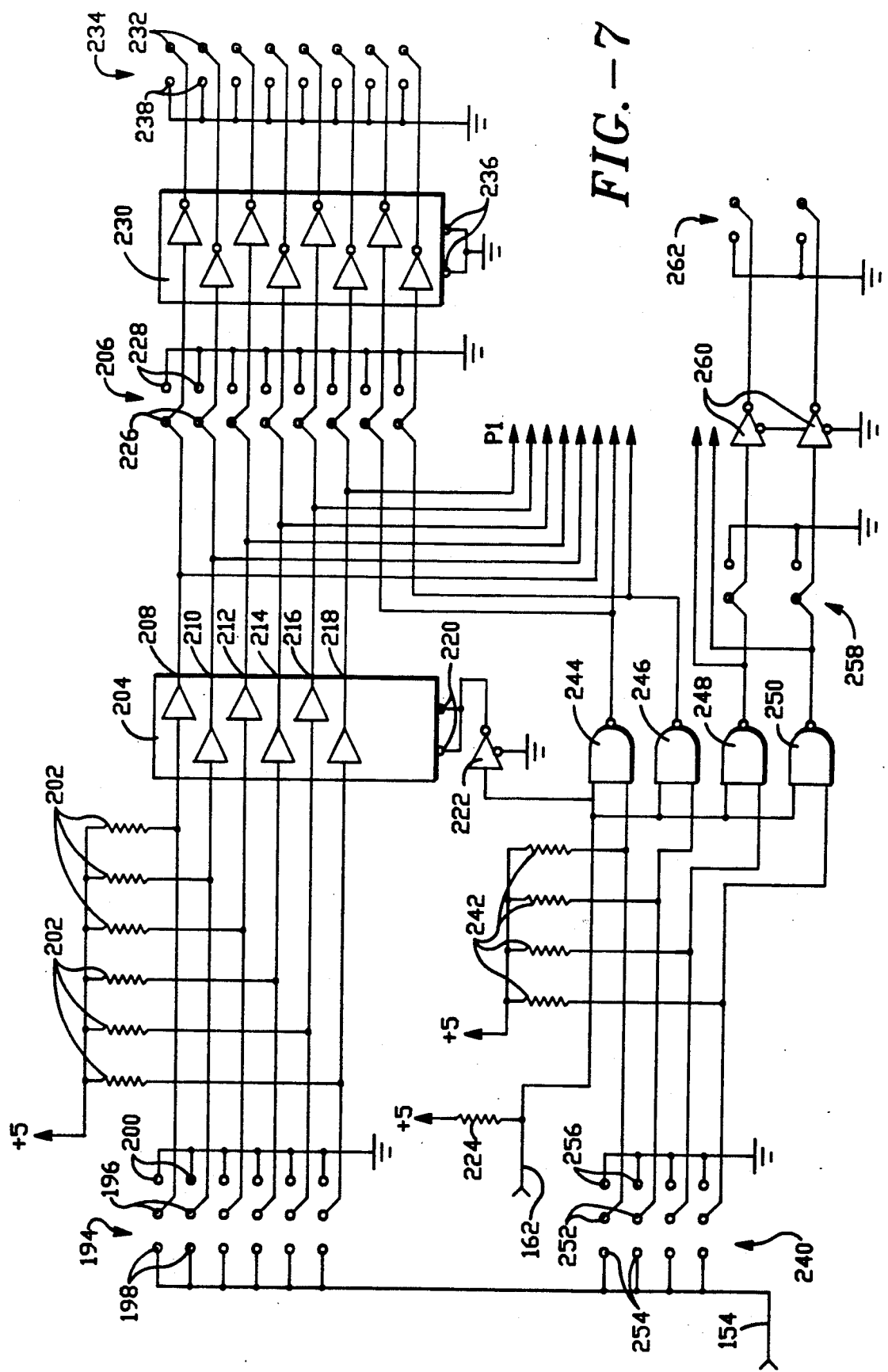

FIGS. 6-7 illustrate circuitry for VMEbus control signals. FIG. 6 illustrates a bus grant in/out implementation. The bus grant lines originate at the P1 connector to the backplane. FIG. 6 illustrates four separate, but functionally identical, bus grant passes (BGnIN*/BGnOUT* passes) that are provided by a single 74LS244 octal line driver 186. The enable inputs 188 are tied to ground so that the line driver is permanently enabled. A BGnIN* signal from the P1 connector is connected at an input 190 of the line driver 186. The signal passes through a non-inverting buffer, whereafter it re-enters the line driver to pass through a second non-inverting buffer for exit of a BGnOUT* signal at an output 192. Each of the bus grants is handled in an identical fashion. The two non-inverting buffers are used to emulate the typical two-gate delay of VMEbus active boards using the bus grant feature. As such, realistic timing measurements can be performed across several test boards installed into a single system. IACKIN/IACKOUT handling is accomplished in a similar manner using two gates of a 74LS240 octal line driver having enable inputs that are tied to ground to provide permanent enablement.

Referring now to FIG. 7, BCLR*, SYSCLK, DS0*, DS1*, AS* and SERCLK signals share common driver and receiver integrated circuits for transmitting to and receiving from the bus. The signals originate at a three-row pin strip 194. Three separate signal sources are available for sending any combination of high, low or clock signals to the VMEbus. A shorting jumper placed by a user between a center pin 196 and a first side pin 198 selects the clock frequency as the source for an associated pin. A shorting jumper placed between the center pin 196 and an opposite side pin 200 selects a low signal to be sent to the bus. The absence of a shorting jumper provides a high signal to the bus, since pull-up resistors 202 are connected to the center pins that lead to a non-inverting octal driver 204.

The non-inverting driver 204 is controlled by enable inputs 220. When the enable inputs are high, the outputs to a two-row pin strip 206 are in a high impedance state, effectively disconnected from the bus. When the enable inputs are low, the outputs to the pin strip 206 are enabled and a signal present at an input is passed to the bus with no change in polarity.

The first output 208 to the driver 204 is the BCLR* signal, the second 210 is the SYSCLK signal, the third 212 is the DS1* signal, the fourth 214 is the DS0* signal, the fifth 216 is the AS* signal, and the sixth 218 is the SERCLK signal. Under the VMEbus specification, each of the signals is outputted to the backplane via the P1 connector.

Enable inputs 220 of the driver 204 are controlled by an inverting buffer 222. The input to the inverting buffer 222 is provided by the SEND line 162 described with reference to FIG. 4. When the SEND switch is in a send position, a pull-up resistor 224 causes the input of the inverting buffer 222 to be in the high state, thereby providing a low output that enables the octal driver 204. When the SEND switch is in a receive position, the SEND line 162 is grounded, which disables the octal driver from the bus.

The outputs 208-218 of the octal driver 204 are connected directly to the P1 connector of the VMEbus. The same signals are channeled to a first row of pins 226 of the pin strip 206. This allows signal monitoring directly off the VMEbus. Pins 228 in a second row are grounded and are used as a signal return.

The same group of signals 208-218 are connected to inputs of an inverting octal bus receiver 230. The outputs of the bus receiver 230 are tied to pins 232 of a two-row pin strip 234. The pin strip 234 allows buffered monitoring of VMEbus signals. The outputs of the bus receiver 230 are permanently enabled by grounding of enable inputs 236. A second row of pins 238 provides a reference ground for signal return in use with the monitoring pins 232.

Signals ACFAIL*, BBSY*, SYSFAIL* and BERR* originate at a three-row pin strip 240. The pin strip 240 functions in the same manner as the pin strip 194 directly above. That is, any of three different signal sources are available for sending any combination of high, low or clock signals to the VMEbus. Pull-up resistors 242 ensure that the inputs to an associated open collector NAND driver 244, 246, 248 and 250 are pulled high when shorting jumpers do not tie center pins 252 to either clock pins 254 or ground pins 256.

Each open collector NAND driver 244-250 has one input tied to the SEND line 162. The state of the SEND line controls enabling of the gates. When the SEND line is high, the NAND drivers are enabled and the signal present at the other gate inputs are passed and inverted prior to connection to the VMEbus at the P1 connector. When the SEND line is low, the NAND drivers are disabled and signals present at the other gate inputs are withheld from the bus.

The outputs of the NAND drivers 244-250 are connected directly to the P1 connector. The ACFAIL* and BBSY* signals are channeled to the two-row pin strip 206 and the bus receiver 230. In like manner, the SYSFAIL* and BERR* signals are received at a monitoring pin strip 258 and a bus receiver 260 to allow a direct monitoring of the signals at the pin strip 258 and a buffered monitoring at a second pin strip 262.

Other signals are handled in an identical manner as described immediately above with reference to the BERR* signal. That is, any one of ground, clock and high signals is presented to the VMEbus after being inverted by an open collector NAND driver having a gate tied to the SEND line 162. The identically handled signals include SYSRESET*, BRn*, DTACK*, IACK*, SERDAT*, IRQn* and RETRY*.

Referring again to FIG. 5, an identical non-inverting signal process is used for LWORD*, WRITE* and AMn signals. Thus, the signals are not inverted, may be any one of high, low or clock signals, and are used with a bus transceiver 164 with three-state outputs for driving onto or receiving from the VMEbus.

Power Testing

Under the VMEbus specification, there is a maximum allowable current load per voltage contact, depending on both the ambient temperature and the manner in which a power grid is connected. In situations in which there will be a high current load per board, it is recommended that the power distribution on active VME boards be broken into power grids, with each grid fed from a different power contact of the backplane connector. The characterization and validation board of the present invention is designed in this manner.

The VMEbus specification allows a maximum current of 2 amp per power contact, if the ambient temperature is 0° C. and the power grids and power contacts are segregated on a one-to-one basis. Referring now to FIGS. 1-3, the test boards 18, 20 and 22 likewise allow a maximum current of 2 amps per power contact. By manipulation of the switches in the banks of switches 30-38, each power contact can be current loaded in increments of approximately 0.5 amp. If the switches are manipulated to provide a 1.5 amp load per power contact, each test board 18-22 will require 1.5 amps for each of +12V, -12V and +5V standby and will require a total of 9 amps for the six +5V power contacts. Thus, to test a fully-populated 6U 21-slot backplane, the +5V rail current will be 9×21, or 189 amps. The current of the other voltage rails will each be 1.5×21, or 31.5 amps. Programming the test boards in this manner allows a user to validate the ability of a system to provide sufficient power and cooling for a proposed system configuration.

Manipulation of the switches in each bank of switches 30-38 to provide a current loading of 1.5 amps per power contact also permits characterization of the backplane power feed and power distribution of the system. Characterization may include the following: power loss in a cable harness between a power supply and the backplane, the ground shift between each daughter board of the backplane, and voltage drop across the backplane and the power contacts of each slot. With regard to characterization of the power loss of a cable harness, ideally a power supply cable harness conveys 100% of a power supply's output to the backplane. However, there are always losses involved through resistance in connections and in the cable itself. An adequate power supply cable harness is one in which the sum total of the voltage drops is such that under system load, the power supply is still able to overcome the losses and present the voltages to the backplane within the specification tolerances.

With the above-described programming of the bank of switches 30-38, there is a current load of 189 amps to the +5V rail and 31.5 amps to all other voltage rails. With the value of current passing through the power supply cable harness, the resistance of the power cable can be determined by measuring the voltage difference between the power supply output terminals and the feed point on the backplane. The resistance of the power cable is equal to voltage drop across cable/current passing through cable. For example, if the voltage drop across a cable path for +5V is 0.378 volt, the resistance is 0.378/189=0.002 ohm. This is an acceptable level. If in characterizing a power harness an unacceptable voltage drop is encountered, a weak point can be isolated by determining the voltage drop across individual components of the power path. It is possible that the wire gauge is sufficient, but the method or type of connection is insufficient.

Ground shift in an operating system environment is always detrimental to system operation. "Ground shift" is defined as a difference in potential between any two points in a system that are designed to be at ground potential. Typically, ground shift is a result of currents that are of sufficient magnitude in the current return path of backplanes to cause a measurable difference in potential. Because ground potential is used as a common reference for switching thresholds and noise margins throughout the system, any shift in the ground potential serves to reduce the switching thresholds and noise immunity of the system.

In measuring ground shift in a backplane, measurements are generally taken directly at the backplane side of connector ground pins, rather than at a board under test. This is because current loading through the connector contacts causes a resultant voltage drop across the contacts that will adversely affect the measurement. However, the test boards 18-22 and front panels 24-28 include the test points 62-68 for reading backplane voltages and ground directly from the front panels. To ensure that no ground return currents adversely affect measurement, there is an isolated and dedicated ground path from ground pin C9 of connector P1 to the test point 68 of each test board. Since no current flows through the ground contacts C9, the readings at the test points 68 are valid.

One of the 21 test boards 18-22 is selected as a reference board. A digital voltmeter is set to read millivolts, with a negative test lead connected to the ground test point 68 of the selected reference board. The positive test lead is sequentially moved to measure the voltage at the ground test points 68 of the remaining 20 test boards. The 20 measurements are recorded. Certain slots in the system will have a lower voltage than others, even in an acceptable system. The measurements may be used in determining in which slots to insert the highest current-drawing VME boards.

The millivolt measurements may also be used to calculate DC path resistance. To do so, the amount of return current each test board 18-22 contributes to the system must be determined. As noted above, the programming of the banks of switches 30-38 provides a 1.5 amp load at each of the nine power contacts. However, the total return current is not 9×1.5 amps, or 13.5 amps. The return currents of the +12V and -12V contacts cancel, so that the total return current is 7×1.5 amps, or 10.5 amps. Thus, DC path resistance on a particular test board 18-22 equals the millivolt measurement for that test board divided by 10 5 amps. Calculation of the DC path resistance enables a user to determine what the ground shift of a particular VME board would be in an actual system. The data sheet of the particular VME board would list the return current value of the board. Consequently, the ground shift is available by multiplying the listed return current value of the board by the calculated DC path resistance.

Characterization of the voltage drop across the backplane depends directly on the amount of copper used in the voltage path of a backplane under test. The calculation of voltage drop is similar to a characterization of ground shift. One test board 18-22 is selected as a reference board. The negative lead of a digital voltmeter that is set to read millivolts is connected to one of the test points 62-66. The positive lead is sequentially connected to the related test point of each of the 20 remaining test boards. The millivolt readings are recorded and used to calculate path resistance relative to the reference board. The same procedure is followed for the remaining eight voltage paths. Measurements at the front panel are valid because each voltage contact has a dedicated path to the test point. The dedicated paths are shown in FIGS. 2 and 3 as including the fusible traces 72-76.

System validation can easily be performed by use of the test boards 18-22. Use of a VMEbus or other bus standard allows a great amount of flexibility. Variables exist in system height, depth and number of slots populated within a system. Each installed board may draw a different amount of current. For a given board, one area may generate more heat than remaining areas. All of these variables have a potential impact on system power and distribution. The test boards may be programmed to emulate current load requirements of a particular board in a particular slot. Moreover, a user may program a test board to emulate hot spots of a particular VME board. If the VME board generates a great amount of thermal energy in an upper right-hand corner of the board, the bank of switches 30-38 can be manipulated to energize the resistors located in that corner of the test board.

Thermal Testing

As noted above, the banks of switches 30-38 can be programmed to emulate the thermal characteristics of a particular board. Other thermal characteristics to be considered include the cooling capabilities of a fan system and whether dead spots exist within the rack mount chassis 10.

To facilitate thermal testing, each front panel 24-28 includes sets of 0.06 diameter holes 264 for thermocouple lead routing. The holes are located along the right side of the front panel so that the leads can easily be routed to the component side of the test board 18-22.

Signal Testing

The active embodiment of the test boards 18-22 reduces the problems associated with signal testing of a bus system. Each active test board has the same interface to the bus, including the driver/receiver devices and stub length. Signal monitoring is provided for all signals, with the exception of the daisy-chained signals, and the return path for any signal is no more than 0.1 inch from the signal monitoring point.

With reference to FIGS. 1 and 4, manipulation of the front panel switches 140 and 142 allows a user to select any one of four clock frequencies. Because the boards are in electrical communication with each other via the backplane, selection of the clock frequency permits a user to test the maximum operational speed of a backplane. The above-described clock circuitry has alternative frequencies of 64, 32, 16 and 8 MHz.

By manipulation of the SEND switch 160, a user can select a certain test board 18-22 to send signals, while the remaining test boards can be programmed to receive. Typically, the sending board is placed in a position in which a CPU board is to be located. The three-row pin strips 170, 194 and 240 of FIGS. 5 and 7 can then be used to program which connector contacts will send or receive signals. The two-row pin strips 182, 206, 234, 258 and 262 may be used to monitor signals and attach oscilloscope probes. In the receive mode, the three-row pin 170 is used for monitoring signals. A configuration which closely approximates the intended system configuration can thereby be established. Test results will directly relate to how well the intended system configuration will operate with actual boards installed.

The degree of crosstalk can also be determined using the active test boards 18-22. Again, one test board is programmed to generate and send signals, while the remaining boards are programmed to receive. A square wave signal may be sent down all signal lines, with the exception of one line that is held at a constant state. An oscilloscope is used to determine crosstalk on the constant state line. To obtain a complete picture, this may be repeated for each signal line.

Signal propagation delay can also be measured. Propagation delay in a perfectly matched and terminated transmission line is a function of the square root of the intrinsic inductance times the intrinsic capacitance of the transmission line. In a typical VMEbus backplane having microstrip and stripline transmission lines, the propagation delay is a function of the square root of the effective dielectric constant of the substrate material. Because the microstrip transmission line is half exposed to air, its propagation delay is less than the delay of a stripline transmission line on the same substrate. The delay increases with the capacitance of printed circuit boards and stubs added to the bus. To measure propagation delay, one active test board 18-22 is programmed to send the signal across the bus and a second test board is used to receive the signal. High-impedance oscilloscope probes are attached to the source and the destination for the purpose of determining the difference in timing.

I claim:

1. A validation and characterization device for testing circuitry that includes a backplane having a plurality of first connectors to interconnect daughter boards, said device comprising, a printed circuit board having a second connector for selective coupling to one of first connectors of said backplane, said second connector having ground and signal contacts and having a plurality of power contacts, a plurality of networks of heat-generating members disposed on said printed circuit board, each network having a plurality of heat-generating members and each network being electrically associated with one of said power contacts of said second connector, and a plurality of switching means for selectively energizing combinations of heat-generating members in said networks, each switching means electrically coupled to one of said networks for providing a potential difference across selected heat-generating members in said one of said networks, said switching means permitting energization of said heat-generating members for emulation of current requirements of a daughter board for use with said backplane.

2. The device of claim 1 wherein said heat-generating members of said networks are resistors connected in a parallel circuit, said switching means connected to selectively link said resistors between ground potential and one of said power contacts.

3. The device of claim 1 further comprising clock means on said printed circuit board for generating a clock signal, said printed circuit board having jumper means for channeling said clock signal to selected signal contacts of said second connector.

4. The device of claim 3 further comprising a switch to selectively disable said printed circuit board from channeling said clock signal to said signal contacts.

5. The device of claim 1 wherein said second connector is on one edge of said printed circuit board and wherein said printed circuit board has a panel fixed to an edge opposite to said second connector, said panel being at a right angle to said printed circuit board, said switching means disposed on said panel.

6. The device of claim 5 wherein said panel includes holes for insertion of leads of a thermocouple.

7. A system for validation and characterization testing of an apparatus having a backplane that includes a plurality of first connectors for providing electrical communication among daughter boards attached to said first connectors, said system comprising,
a plurality of printed circuit boards, each having second connector means for electrically coupling said printed circuit board to a first connector of said backplane, said second connector means including power, ground and signal contacts,
a plurality of networks of resistors disposed on each of a first surface of each of said printed circuit boards, each network including parallel circuits of resistors, said parallel circuits in a network having first terminations connected to ground potential and second terminations for selective connection to one of said power contacts, and
a plurality of switches coupled to each of said printed circuit boards, each switch connected to an associated one of said parallel circuits to selectively link said second terminations to said one of said power contacts.

8. The system of claim 7 further comprising a plurality of panels, each printed circuit board having one of said panels at an end opposite to said second connector means, said switches disposed on said panels.

9. The system of claim 8 wherein said panel includes a first test point and each printed circuit board includes a dedicated conductive path from a ground contact to connection with said first test point, measuring of a voltage drop from a first test point of one of said printed circuit boards to a first test point of a second printed circuit board providing an indication of ground shift.

10. The system of claim 9 wherein each printed circuit board includes dedicated conductive paths of each of said power contacts, said panel having test points in electrical communication with said dedicated conductive paths.

11. The system of claim 7 wherein each printed circuit board includes a clock means for generating a first clock signal of a predetermined frequency and includes means for dividing said clock signal to provide a second clock signal of a frequency less than said predetermined frequency, said system further comprising a switch for selecting one of said first and second clock signals as an output from a signal contact, said output from a signal contact of a first printed circuit board being an input to said plurality of printed circuit boards.

12. The system of claim 11 wherein each of said second connector means has an identical assignment of ground, signal and power contacts.

13. A board assembly for characterizing and validating a bus system having a backplane interconnecting a plurality of daughter boards comprising,
a substrate having a connector mechanically and electrically coupled to said backplane, said connector having a contact assignment of ground, power and signal contacts that corresponds to the contact assignment of said daughter boards,
a plurality of heat-generating members on a first surface of said substrate for electrical connection between ground and one of said power contacts,
clock circuit means on said substrate for generating a first clock signal and for dividing said first clock signal to provide a second clock signal,
switch means connected to said clock circuit means for selecting between outputting said first and second clock signals from a plurality of said signal contacts for input to said plurality of daughter boards via said bus system, and
control means for transmitting bus control signals to said bus system and for receiving bus control signals from said bus system.

14. The system of claim 13 wherein said heat-generating members are networks of resistors, each network of resistors operatively associated with one of said power contacts in each resistor in a network being selectively connected to said operatively associated power contact by a switch.

15. The assembly of claim 13 wherein said signal contacts include data contacts and bus contacts of said bus system, said switch means outputting said first and second clock signals to both said data contacts and said signal contacts.

16. The assembly of claim 14 further comprising a panel on said substrate, said switches and said switch means disposed on said panel.

17. The assembly of claim 14 further comprising a plurality of substrates, each having said networks of resistors, having said clock circuit means and having a connector mechanically and electrically coupling said substrate to said backplane.

* * * * *